United States Patent [19]
Tanaka et al.

[11] Patent Number: 6,021,060
[45] Date of Patent: Feb. 1, 2000

[54] POWER CONVERTER DEVICE

[75] Inventors: Takeshi Tanaka; Tatsumi Ishida, both of Tokyo, Japan

[73] Assignee: Mitsubishi Denki Kabushiki Kaisha, Tokyo, Japan

[21] Appl. No.: 09/309,303

[22] Filed: May 11, 1999

[30] Foreign Application Priority Data

May 11, 1998 [JP] Japan ................................. 10-127622

[51] Int. Cl.⁷ .............................................. H02M 7/5387
[52] U.S. Cl. .............................................. 363/132; 363/98
[58] Field of Search ................................. 363/16, 17, 97, 363/98, 131, 132

[56] References Cited

U.S. PATENT DOCUMENTS

| | | | |
|---|---|---|---|
| 5,063,490 | 11/1991 | Maehara et al. | 363/37 |
| 5,113,126 | 5/1992 | Nanzan et al. | 318/809 |
| 5,673,188 | 9/1997 | Lusher et al. | 363/132 |
| 5,717,585 | 2/1998 | Nguyen et al. | 363/98 |
| 5,933,341 | 8/1999 | Kuriyama et al. | 363/98 |

OTHER PUBLICATIONS

IEEE Aug. 1998, pp. 1196–1200, "High Performance Gate Drive Circuit of High Voltage IPMs (HVIPMs)", Kimata, M. et al.

*Primary Examiner*—Matthew Nguyen
*Attorney, Agent, or Firm*—Sughrue, Mion, Zinn Macpeak & Seas, PLLC

[57] ABSTRACT

Respective terminals and connecting means provided between respective terminals are arranged such that both a current path of a first current extending from an alternating current output terminal 7 (AC) to a negative terminal N of a capacitor 10 via a switching device SW2 and a current path of a second current extending from the alternating current output terminal 7 (AC) to a positive terminal P of the capacitor 10 via a switching device SW1 are provided to construct round current paths whose forward and backward current paths are positioned mutually in a close vicinity respectively. As a result, a snubber circuit can be omitted, and also a power converter device which has reduced size, lower loss, lower cost, and higher reliability can be achieved.

9 Claims, 14 Drawing Sheets

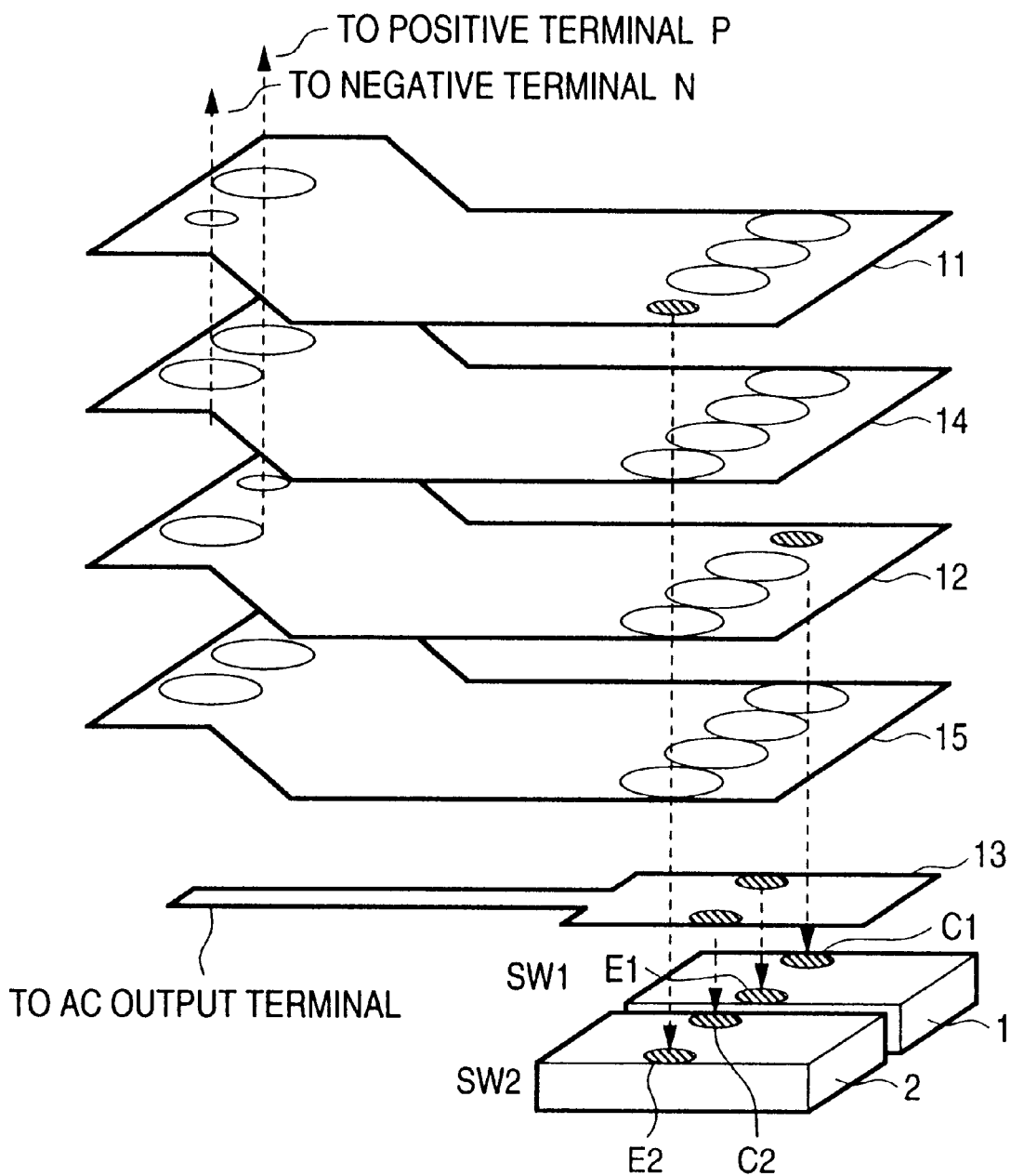

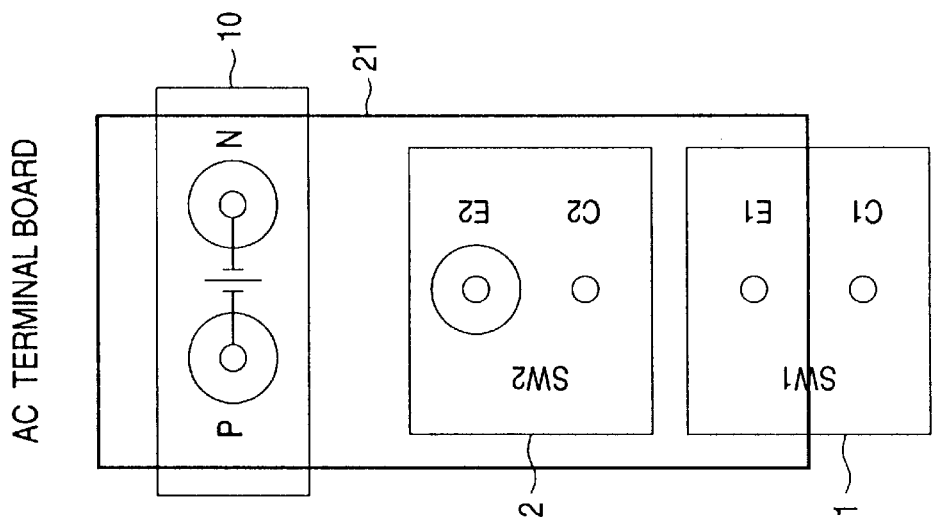
FIG. 15A  P TERMINAL BOARD
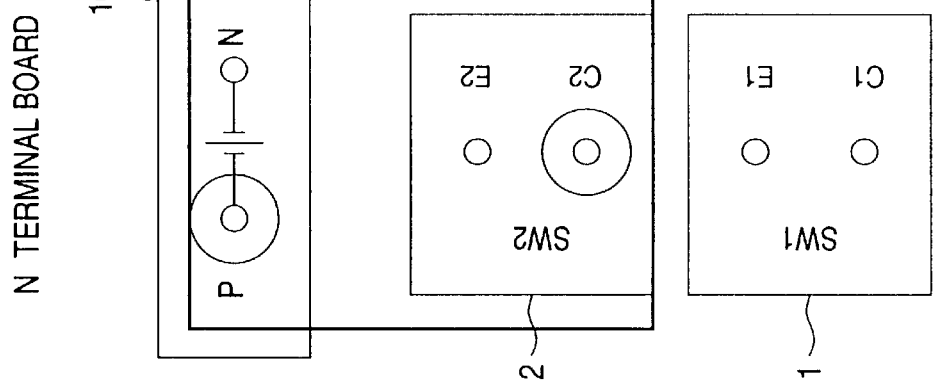
FIG. 15B  N TERMINAL BOARD
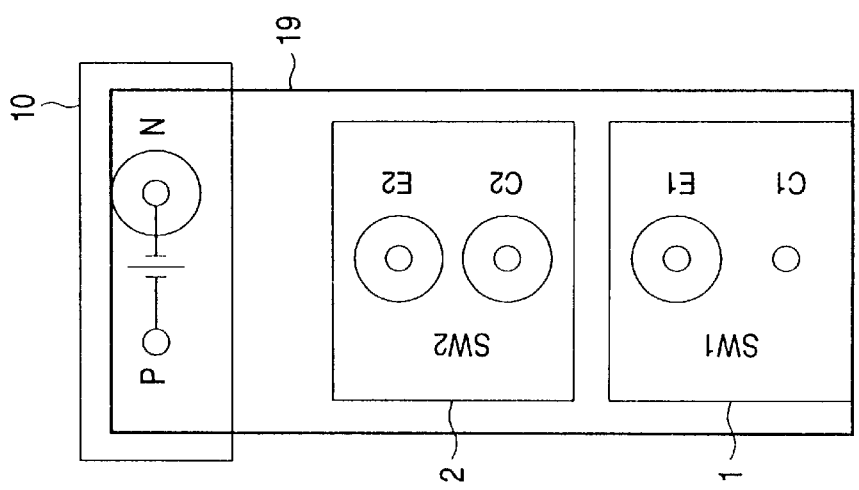
FIG. 15C  AC TERMINAL BOARD

POWER CONVERTER DEVICE

BACKGROUND OF THE INVENTION

1. Field of the Invention

The present invention relates to a power converter device such as a 2-level inverter, a 2-level converter, etc. for executing power conversion between a direct current (DC) and a 2-level alternating current (AC) and, more particularly, a technology of reducing internal inductances of the power converter device.

2. Description of the Prior Art

FIG. 18 shows a power converter device set forth in Patent Application Publication (KOKAI) Hei 6-225545, for example, and more particularly a main circuit of a 2-level power converter device which converts DC power into three-phase AC power. In FIG. 18, a reference 10 denotes a capacitor serving as a DC voltage source, and references 1 to 6 denotes switching elements SW1 to SW6 which are connected to form a bridge circuit. The switching elements SW1 to SW6 consist of IGBTs (Insulated Gate Bipolar Transistors) 1A to 6A and fly wheel diodes 1B to 6B which are connected in inverse-parallel with the IGBTs 1A to 6A respectively. References 7 to 9 are AC output terminals respectively.

Since a normal circuit operation of the power converter device of this type has been well known, its explanation will be omitted herein. However, induced voltages each of which is defined by a product of a current change rate di/dt which is caused by a turn-off operation of each switching device and an inductance which exists in the circuit wiring become an issue particularly. That is to say, these induced voltages would reduce a breakdown voltage of the switching device. As the measure to overcome the issue, normally such a method has been adopted that the so-called snubber circuit is provided to consume the electromagnetic energy which is generated by the inductance of the circuit. In this case, if the inductance is increased larger, a capacity of a capacitor constituting the snubber circuit is also increased correspondingly. Thus, bad effects such that the power converter device is increased in size to thus increase its loss, etc. have been caused.

As for this respect, in the above Patent Application Publication, inductances of the circuit wirings, especially an inductance Lsa of a wiring, which connects a positive terminal of a capacitor 10 and an anode terminal of a switching device SW1, and an inductance Lsb of a wiring, which connects a negative terminal of a capacitor 10 and a cathode terminal of a switching device SW2, have been watched with interest. Then, the circuit wirings provided in such areas have been formed by a pair of conductive plates and a spacing plate, which is formed of high dielectric-constant material and inserted between the pair of conductive plates, to thus achieve reduction of the inductances.

Since reduction of the inductances has been made as mentioned above in the power converter device in the prior art, a satisfactory effect has not always been achieved in the event that a larger capacity of the switching device, an increase in a switching frequency, etc. are requested. In other words, though described in detail later, overall current paths including the switching devices, which range from the positive terminal P of the DC voltage source to the negative terminal N of the same must be grasped as the subject of study, and then a configuration which is able to minimize the inductance of such overall current paths must be studied.

SUMMARY OF THE INVENTION

The present invention has been made in light of the above viewpoint, and it is an object of the present invention to provide a power converter device is capable of reducing thoroughly inductances of the circuit wirings.

A power converter device according to the present invention, comprises a direct current voltage source having a positive terminal and a negative terminal; a first switching device whose anode terminal is connected to the positive terminal of the direct current voltage source; a second switching device whose anode terminal is connected to a cathode terminal of the first switching device and whose cathode terminal is connected to the negative terminal of the direct current voltage source; and an alternating current output terminal extended from a connection point of the first switching device and the second switching device; a first current path, which extends from the alternating current output terminal to the negative terminal of the direct current voltage source via the second switching device, is provided to form a first round current path whose go and return current paths are positioned mutually in a close vicinity; and second current path, which extends from the alternating current output terminal to the positive terminal of the direct current voltage source via the first switching device, is provided to form a second round current path whose go and return current paths are positioned mutually in the close vicinity.

In the power converter device according to the invention, terminals of the first switching device and the second switching device are aligned substantially in a straight line, a direction connecting both terminals of the direct current voltage source is set substantially in parallel with a direction of the straight line, and the alternating current output terminal is positioned in a middle position between both terminals of the direct current voltage source.

In the power converter device according to the invention, a direction directed from the positive terminal of the direct current voltage source to the negative terminal thereof is set to coincide with a direction directed from the anode terminal of the first switching device to the cathode terminal thereof and a direction directed from the anode terminal of the second switching device to the cathode terminal thereof.

In the power converter device according to the invention, a direction directed from the positive terminal of the direct current voltage source to the negative terminal thereof is set to coincide with a direction directed from the cathode terminal of the first switching device to the anode terminal thereof and a direction directed from the cathode terminal of the second switching device to the anode terminal thereof.

In the power converter device according to the invention, terminals of the first switching device and the second switching device are aligned substantially in a straight line, a direction connecting both terminals of the direct current voltage source is set by a substantially right angle relative to a direction of the straight line, and the alternating current output terminal is positioned in a middle position between both terminals of the direct current voltage source.

In the power converter device according to the invention, the first switching device is positioned close to the direct current voltage source rather than the second switching device.

In the power converter device according to the invention, the second switching device is positioned close to the direct current voltage source rather than the first switching device.

In the power converter device according to the invention, wiring plates which are superposed in parallel each other through an insulating plate respectively are provided whereby connecting the positive terminal of the direct current voltage source and the anode terminal of the first switching device, connecting the negative terminal of the direct current voltage source and the cathode terminal of the second switching device, and connecting the cathode terminal of the first switching device, the anode terminal of the second switching device, and the alternating current output terminal.

A power converter device according to the invention, comprises a plurality of power converter devices set forth in any one of the above mentioned; wherein multi-phase alternating current voltages which have phase difference mutually can be output.

BRIEF DESCRIPTION OF THE DRAWINGS

FIG. 8 is a perspective view showing an exploded state of the plate-like terminal boards;

FIGS. 15A, 15B, 15C are plan views showing a connection configuration in the power converter device when the plate-like terminal boards are employed;

DESCRIPTION OF THE PREFERRED EMBODIMENTS

Embodiments of the present invention will be explained with reference to the accompanying drawings hereinafter.

Embodiment 1

Figure 1:
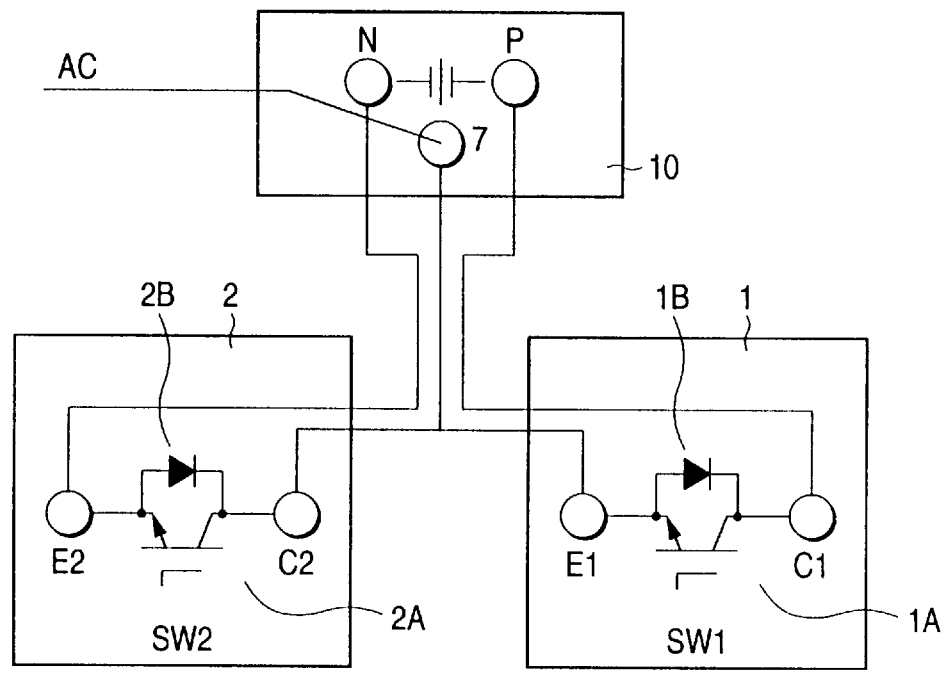
FIG. 1 is a view showing a configuration of element and terminal arrangements and their connection in a power converter device according to an embodiment 1 of the present invention.

FIG. 1 shows arrangement of constituent elements, their terminal positions, and their connection procedures in one-phase configuration of a power converter device according to an embodiment 1 of the present invention. In FIG. 1, a reference 1 denotes a switching device SW1 which is composed of an IGBT 1A and a fly wheel diode 1B which is connected in inverse-parallel with the IGBT 1A. Where C1 is a collector terminal acting as an anode terminal of the switching device SW1, and E1 is an emitter terminal acting as a cathode terminal of the switching device SW1. A reference 2 denotes a switching device SW2 which is composed of an IGBT 2A and a fly wheel diode 2B. Where C2 is a collector terminal acting as an anode terminal of the switching device SW2, and E2 is an emitter terminal acting as a cathode terminal of the switching device SW2. The switching devices SW1, SW2 are arranged such that respective terminals of both switching devices are aligned in a straight line in the order of C1, E1, C2, E2 from the right to the left in FIG. 1.

A reference 10 denotes a capacitor acting as a DC voltage source, wherein P is a positive terminal and N is a negative terminal. Relative positions of the switching devices SW1, SW2 and the capacitor 10 are decided such that the direction connecting the positive terminal P and the negative terminal N of the capacitor 10 can be positioned in parallel with the direction connecting the above terminals C1 to E2.

In this manner, in order to reduce the wiring inductance much more, respective terminal positions as well as the relative positions of respective constituent parts are specified in the present invention. In order to show the ground to employ these arrangements, first of all a typical commutating operation of the power converter device of this type will be explained in detail in the following.

Figure 2:
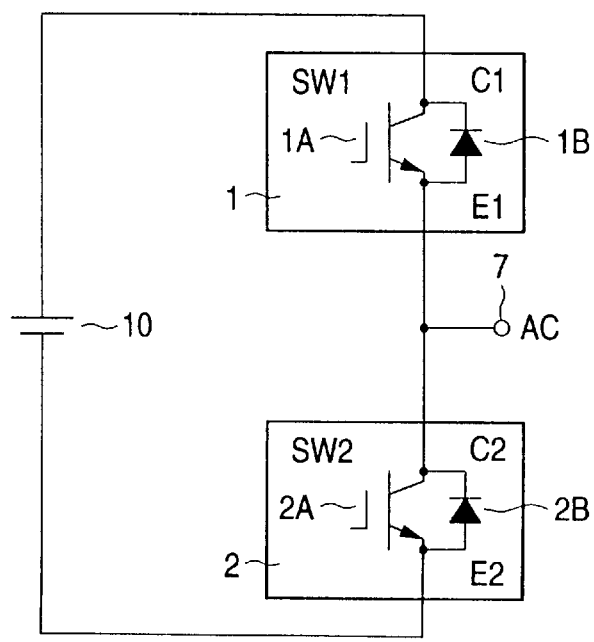
FIG. 2 is a simplified circuit diagram of the power converter device in FIG. 1.

FIG. 2 shows a simplified circuit diagram of the power converter device in FIG. 1 as a usual connection diagram, for convenience of following explanation. The typical commutating operation will be explained with reference to FIGS. 3A and 3B depicted based on FIG. 2 hereunder.

Figure 3A:
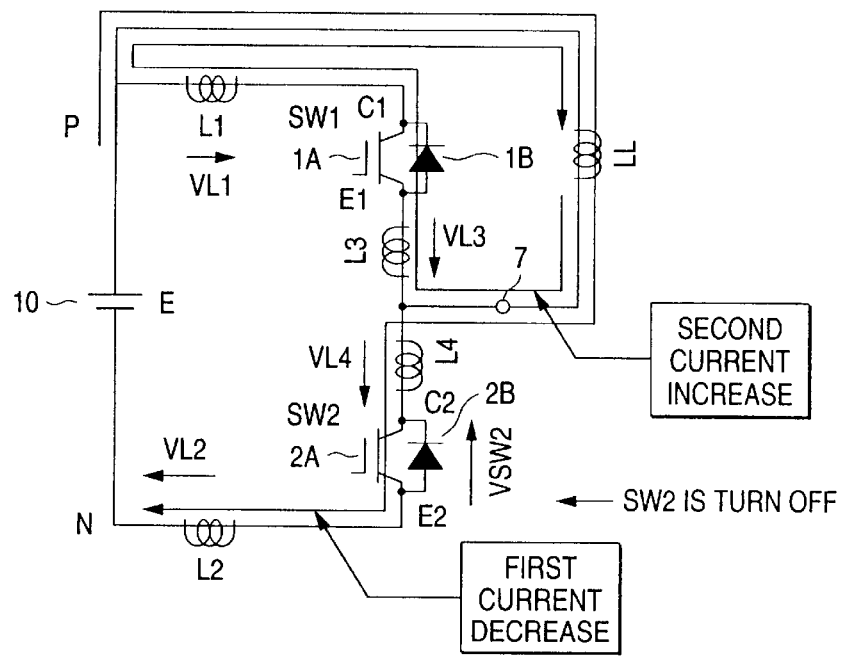
FIGS. 3A and 3B are views showing a commutating operation of the power converter device respectively.
Figure 3B:
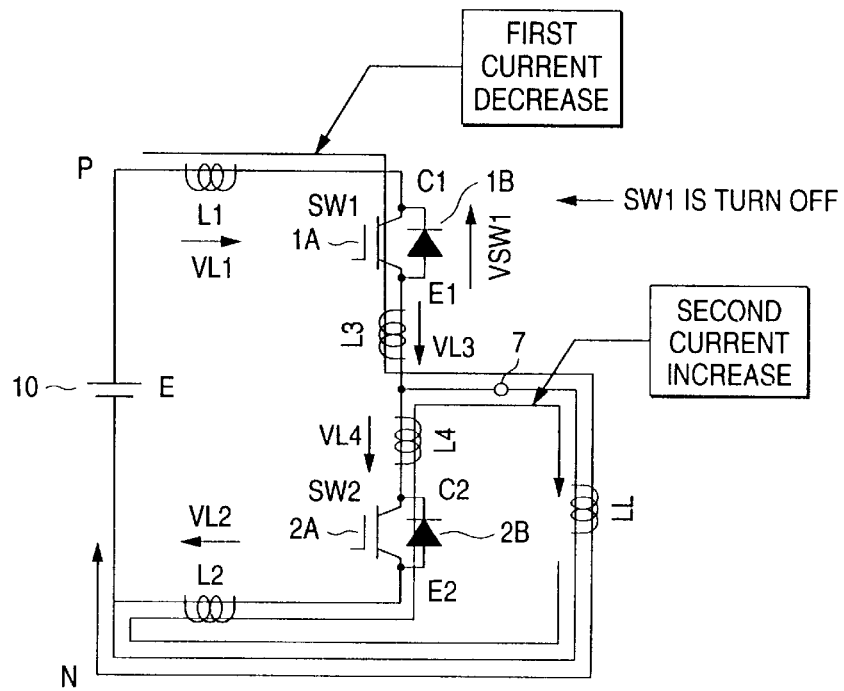

First, FIG. 3A shows the commutating operation executed when the IGBT 2A of the switching device SW2 is turn off in the state that the switching device SW2 is ON and the switching device SW1 is OFF.

Figure 4:
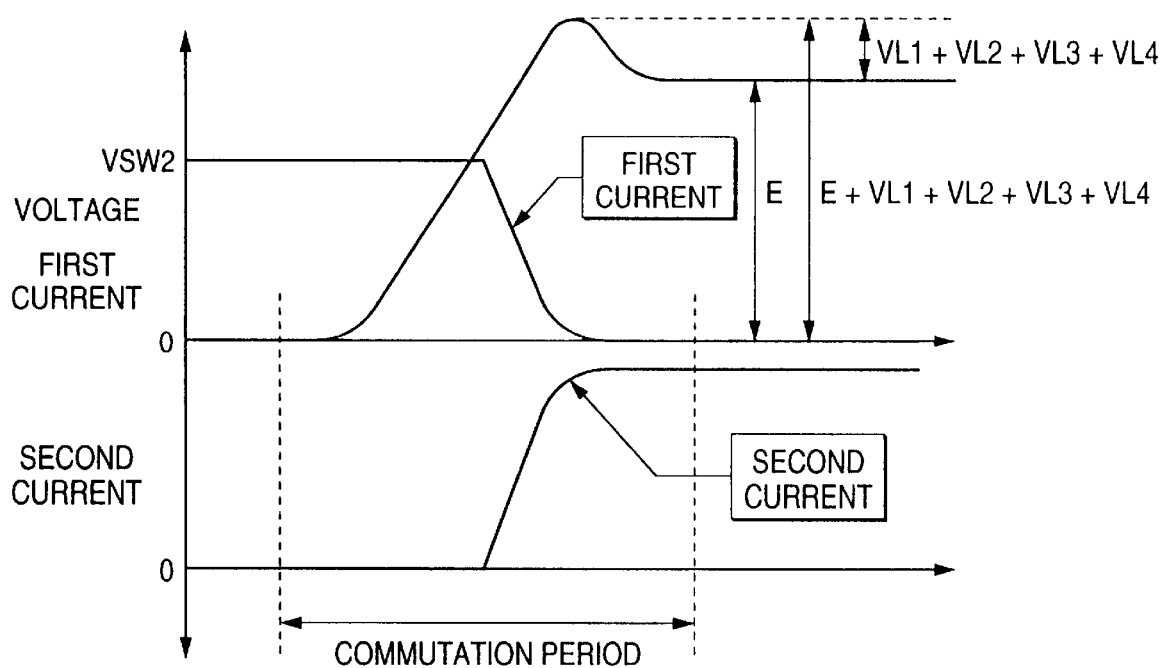
FIG. 4 is a view showing respective waveforms in the power converter device during the commutating operation.

More particularly, when the IGBT 2A starts its turn-off operation in the state that the IGBT 2A is ON and a first current is flowing via a route of the positive terminal P of the capacitor 10→a load LL→an AC output terminal 7→the IGBT 2A→the negative terminal N of the capacitor 10, a current of the load LL is commutated from the first current to the second current, i.e., the current which flows via a route of the positive terminal P of the capacitor 10→the load LL→the AC output terminal 7→a fly wheel diode 1B→the positive terminal P of the capacitor 10, while it is maintained at a constant value. At this time, respective waveforms of a voltage VSW2 of the switching device SW2, the first current, and the second current are shown in FIG. 4.

At the time of this commutation, the first current is decreased according to a current change rate di/dt which is defined by the IGBT 2A. Thus, induced voltages VL2= L2·di/dt, VL4=L4·di/dt are generated by the current change rate di/dt in main circuit wiring inductances L2, L4 in the directions indicated by arrows in FIG. 3A respectively. In this case, an inductance existing between the negative terminal N of the capacitor 10 and the emitter terminal E2 of the switching device SW2 is assumed as the main circuit wiring inductance L2, whereas an inductance existing between the emitter terminal E2 of the switching device SW2 and the AC output terminal 7 (a connection point of the switching devices SW1, SW2 when such connection point of the switching devices SW1, SW2 is positioned prior to the AC output terminal 7) is supposed as the main circuit wiring inductances L4.

In contrast, the second current which flows via the fly wheel diode 1B is increased conversely according to the current change rate di/dt. Thus, induced voltages VL1=L1·di/dt, VL3=L3·di/dt are generated by the current change rate di/dt in main circuit wiring inductances L1, L3 in the directions indicated by arrows in FIG. 3A respectively. In this case, an inductance existing between the positive terminal P of the capacitor 10 and the collector terminal C1 of the switching device SW1 is assumed as the main circuit wiring inductance L1, whereas an inductance existing between the collector terminal C1 of the switching device SW1 and the AC output terminal 7 (the connection point of the switching devices SW1, SW2 when such connection point of the switching devices SW1, SW2 is positioned prior to the AC output terminal 7) is supposed as the main circuit wiring inductances L3.

As the result of the above operations, when the switching device SW2 is turned off, the voltage VSW2 which is given as a voltage E of the capacitor 10+VL1+VL2+VL3+VL4 is applied as a turn-off surge voltage.

Then, the commutating operation executed when the switching device SW1 is turn-off will be explained with reference to FIG. 3B hereunder.

When the IGBT 1A starts its turn-off operation in the state that the IGBT 1A is ON and the first current is flowing via a route of the positive terminal P of the capacitor 10→the IGBT 1A→the AC output terminal 7→the load LL→the negative terminal N of the capacitor 10, the current of the load LL is commutated from the first current to the second current, i.e., the current which flows via a route of the negative terminal N of the capacitor 10→a fly wheel diode 2B→the AC output terminal 7→the load LL→the negative terminal N of the capacitor 10, while it is maintained at a constant value. At this time, respective waveforms of a voltage VSW1 of the switching device SW1, the first current, and the second current become identical to those explained in the switching device SW2 previously in FIG. 4.

At the time of this commutation, the first current is decreased according to the current change rate di/dt which is defined by the IGBT 1A. Thus, induced voltages VL1=L1·di/dt, VL3=L3·di/dt are generated by the current change rate di/dt in main circuit wiring inductances L1, L3 in the directions indicated by arrows in FIG. 3B respectively.

In contrast, the second current which flows via the fly wheel diode 2B is increased conversely according to the current change rate di/dt. Thus, induced voltages VL2=L2·di/dt, VL4=L4·di/dt are generated by the current change rate di/dt in main circuit wiring inductances L2, L4 in directions indicated by arrows in FIG. 3B respectively.

As the result of the above operation, when the switching device SW1 is turned off, the voltage VSW1 which is given as the voltage E of the capacitor 10+VL1+VL2+VL3+VL4 is applied as the turn-off surge voltage.

As can be understood from the above explanation, the commutating operations in FIGS. 3A and 3B are performed symmetrically and thus the following measure for reducing the inductance will be explained for convenience, while taking only the operation in FIG. 3A, i.e., the turn-off operation of the switching device SW2 as the subject. Accordingly, assume that the first current and the second current described in the following correspond to those set forth in FIG. 3A.

By the way, the main circuit wiring inductance is affected by a length of the wiring and a magnitude of a magnetic field which is generated according to the so-called law of right-hand thread when the current flows through this wiring. Therefore, only the reduction in the length of the wiring is insufficient to reduce the main circuit wiring inductances. Thus, it becomes important to reduce the magnetic field due to the flow of the current.

Figure 5:
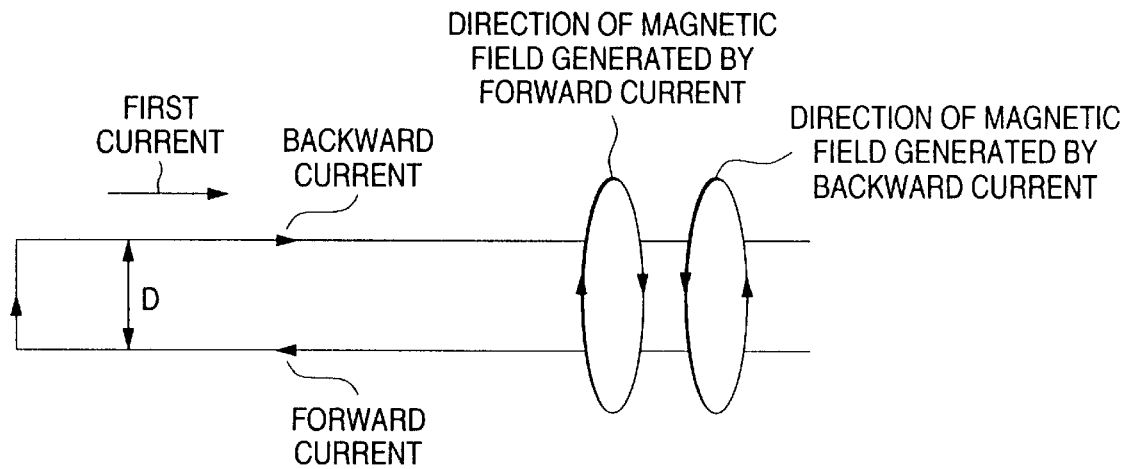
FIG. 5 is a view showing the principle to reduce main circuit wiring inductances of the power converter device.

FIG. 5 is a view showing the principle to reduce the main circuit wiring inductances L2, L4 being generated in a current flow path of the first current, for example. In other words, the current flow path of the first current is constructed as a round current path which is composed of a forward current path and a backward current path, and then a distance D between the forward current path and the backward current path is set as small as possible.

As shown in FIG. 5, since the direction of the magnetic field generated by the forward current is opposite to that of the magnetic field generated by the backward current, mutually canceled components of both magnetic fields are increased by reducing the above distance D. As a result, the main circuit wiring inductance can be reduced extremely.

In this case, according to FIG. 3A, it is sufficient for the round current path of the first current to set the route of the AC output terminal 7→the switching device SW2→the negative terminal N of the capacitor 10 as the range of the subject. While, it is sufficient for the round current path of the second current to set the route of the AC output terminal 7→the switching device SW1→the positive terminal P of the capacitor 10 as the range of the subject.

Figure 6:
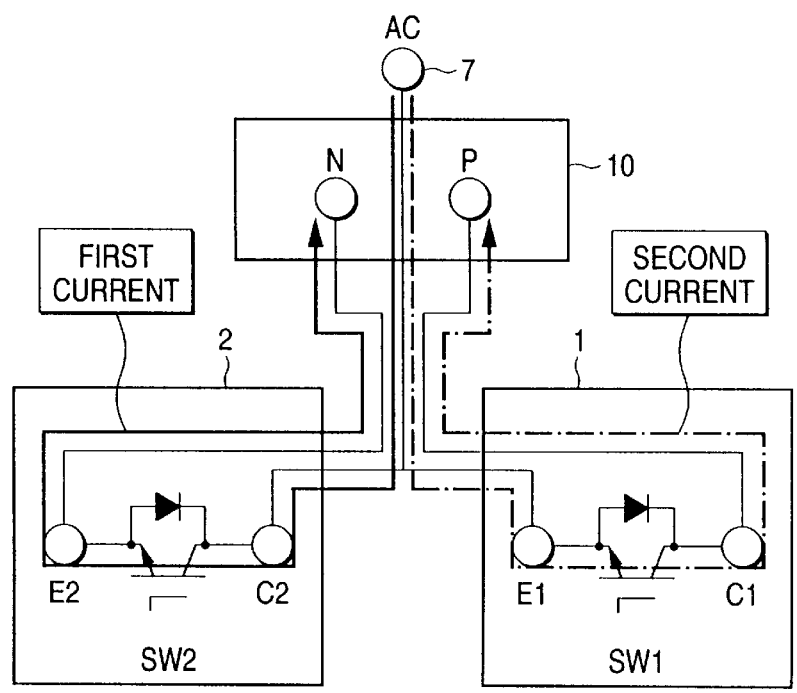
FIG. 6 is a view showing current flow paths of the first current and the second current depicted in FIG. 1.

FIG. 6 is a view showing the above routes of the first current and the second current depicted in the previous configuration in FIG. 1. In other words, the round current path of the first current indicated by a thick solid line must be constructed via the route of the AC output terminal 7→the collector terminal C2 of the switching device SW2→the emitter terminal E2 of the same→the negative terminal N of the capacitor 10 such that the forward current path and the backward current path can always be positioned in the close vicinity.

Then, the round current path of the second current indicated by a thick chain line must be constructed via the route of the AC output terminal 7→the emitter terminal E2 of the switching device SW→the collector terminal C1 of the same→the positive terminal P of the capacitor 10 such that similarly the forward current path and the backward current path can always be positioned in the close vicinity.

As the result of the above configuration, the main circuit wiring inductances L2, L4 as well as main circuit wiring inductances L1, L3, both have an influence upon the turn-off surge voltage, can be reduced significantly.

Figure 7C:
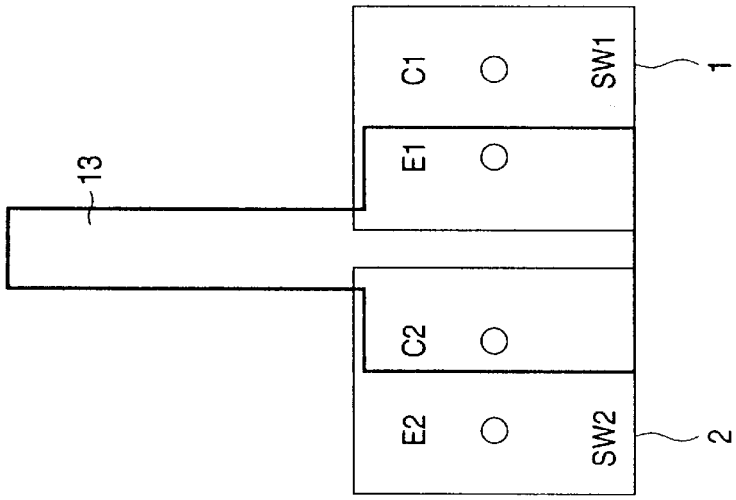
FIGS. 7A, 7B, 7C are plan views showing a connection configuration in the power converter device when the plate-like terminal boards are employed.
Figure 7B:
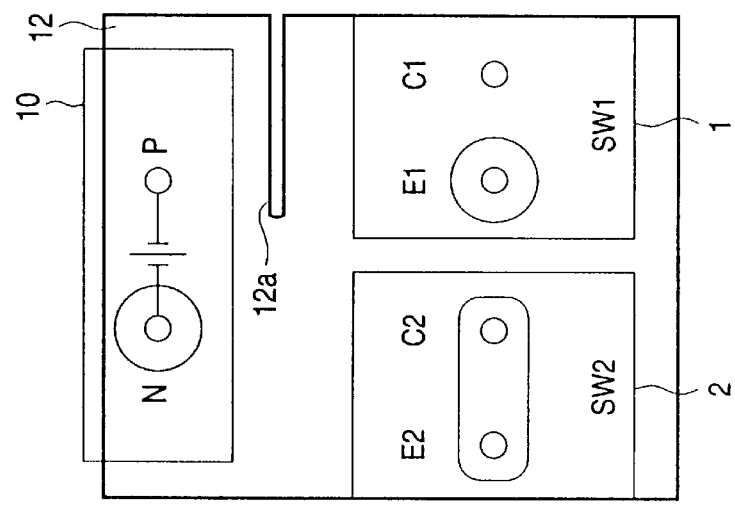
Figure 7A:
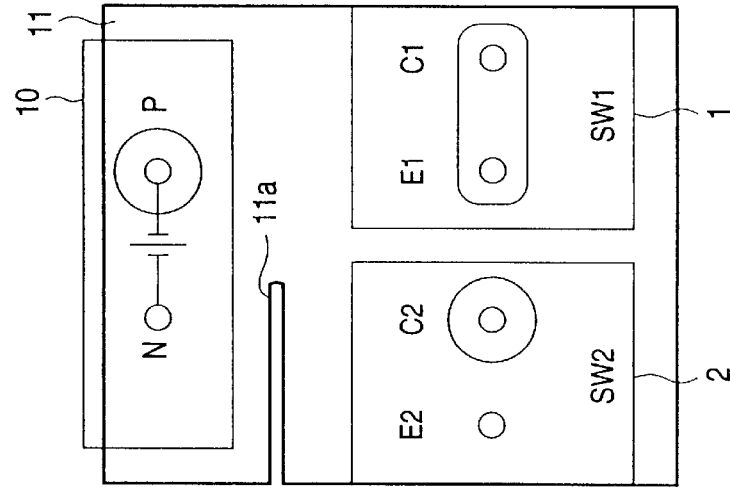

FIGS. 7A to 7C and FIG. 8 show configurations for reducing the main circuit wiring inductance much more by employing plate-like terminal boards as a means for connecting respective terminals. FIGS. 7A, 7B, 7C are plan views showing a connection configuration when the plate-like terminal boards are employed. FIG. 8 is a perspective view showing an exploded state of the plate-like terminal boards.

In FIGS. 7A to 7C and FIG. 8, a reference 11 denotes an N terminal board which is positioned at the uppermost stage. The N terminal board 11 is a plate-like terminal board which connects the negative terminal N of the capacitor 10 and the emitter terminal E2 of the switching device SW2. In this event, connection between the N terminal board 11 and the emitter terminal E2 of the switching device SW2 is conducted by passing through a stud screw, which is provided in the switching device SW2, up to the N terminal board 11 and then fastening the stud screw with a nut, for example. For this reason, in order to ensure electric insulation from the stud screw, holes each having a necessary diameter are provided in the P terminal board 12, etc. which are positioned at the stage lower than the N terminal board 11, as shown in FIG. 8. Further, in FIG. 7A, a reference 11a denotes a slit being formed on a part of the N terminal board 11. This slit 11a is formed to achieve substantial reduction in the distance between the forward current path and the backward current path explained previously much more by directing the current flow path between the negative terminal N of the capacitor 10 and the emitter terminal E2 of the switching device SW2 toward the middle area of the N terminal board 11 as much as possible.

A reference 12 denotes the P terminal board which is positioned below the N terminal board 11 via an insulating board 14. This P terminal board 12 is a plate-like terminal board which connects the positive terminal P of the capacitor 10 and the collector terminal C1 of the switching device SW1. In this case, a reference 12a denotes a slit which is formed in a part of the P terminal board 12 for the same purpose as the slit 11a being already mentioned.

A reference 13 denotes an AC terminal board which is positioned below the P terminal board 12 via an insulating board 15. This AC terminal board 13 is a plate-like terminal board which connects the AC output terminal 7, the emitter terminal E1 of the switching device SW1, and the collector terminal C2 of the switching device SW2.

As discussed above, since both the round current path of the first current and the round current path of the second current are formed by the structure in which the terminal boards 11 to 13 which have a large area respectively are arranged to be superposed in parallel with each other via a minute clearance, the main circuit wiring inductances can be reduced considerably and thus the turn-off surge voltage can be suppressed smaller. As a result, the snubber circuit can be omitted, and therefore size reduction, lower loss, and lower cost of the power converter device can be achieved. Further, because of reduction in the number of parts, reliability of the power converter device can be improved.

Embodiment 2

Figure 9C:
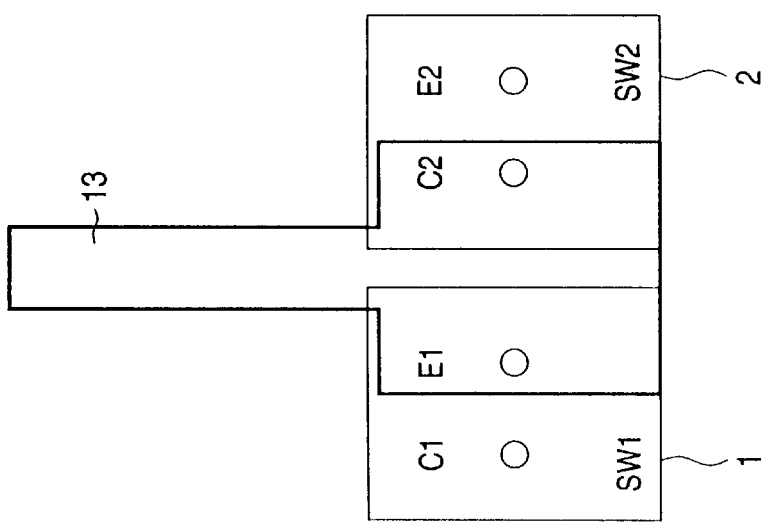
FIGS. 9A, 9B, 9C are plan views showing a power converter device according to an embodiment 2 of the present invention.
Figure 9B:
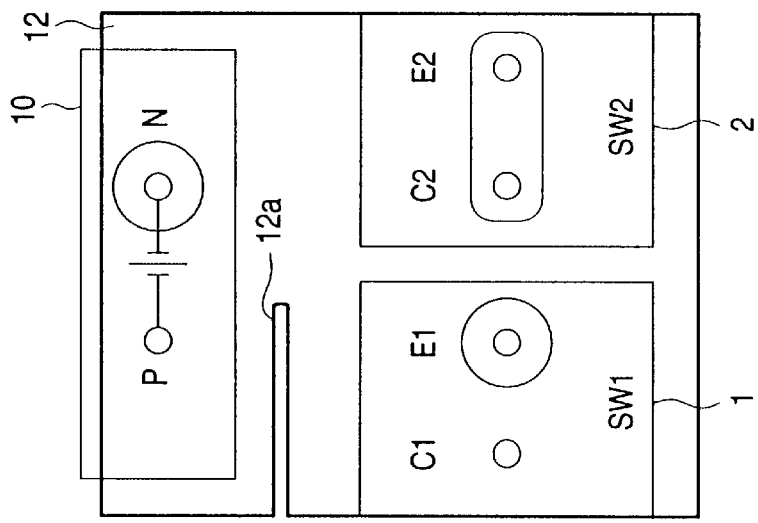
Figure 9A:
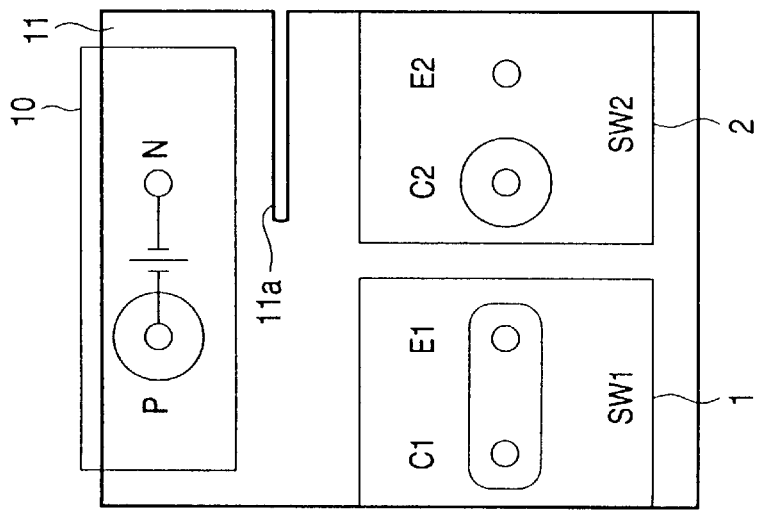

FIGS. 9A, 9B, 9C show a power converter device according to an embodiment 2 of the present invention. In particular, FIGS. 9A, 9B, 9C, which correspond to FIGS. 7A, 7B, 7C in the above embodiment 1, are plan views showing an N terminal board 11, a P terminal board 12, and an AC terminal board 13. A difference of the embodiment 2 from the structures in FIGS. 7A, 7B, 7C resides in that, in FIGS. 9A, 9B, 9C, arrangements of the N terminal board 11, the P terminal board 12, and the AC terminal board 13 are completely reversed in the lateral direction respectively. Accordingly, the connection structures between the terminals are bilateraly symmetrical to those in FIGS. 7A, 7B, 7C respectively. Therefore, the main circuit wiring inductances become totally identical to the case in FIGS. 7A, 7B, 7C since they are decided based on relative positional relationships of the above arrangements and the above connection structures.

As a result, like the case shown in FIGS. 7A, 7B, 7C, the main circuit wiring inductances can be reduced considerably although redundant detailed explanation is avoided.

Embodiment 3

Figure 10:
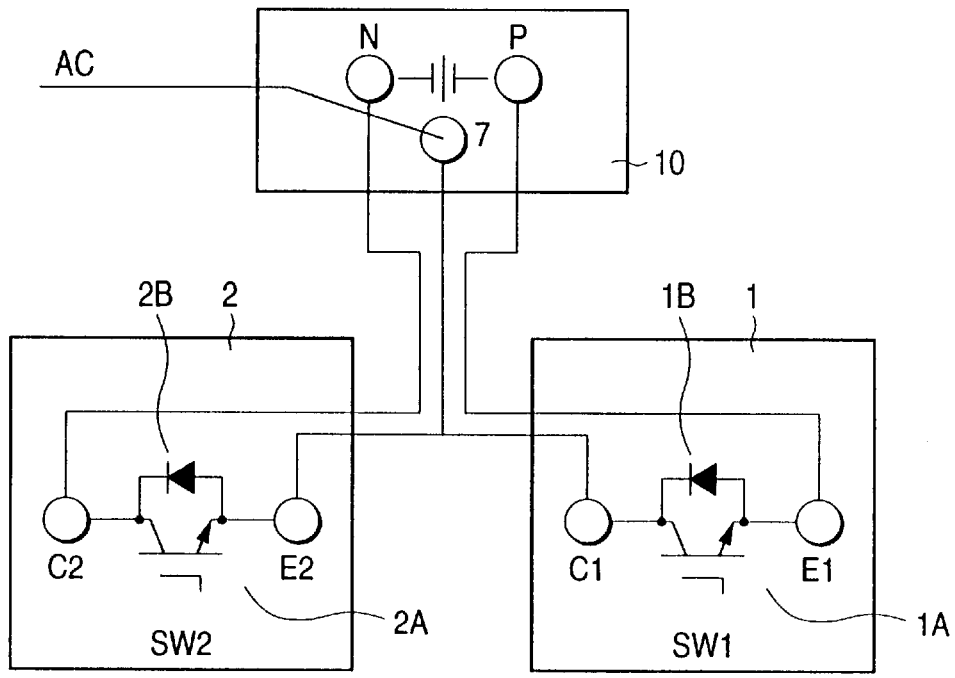
FIG. 10 is a view showing a configuration of element and terminal arrangements and their connection in a power converter device according to an embodiment 3 of the present invention.

FIG. 10 shows arrangement of constituent elements, their terminal positions, and their connection procedures in one-phase configuration of a power converter device according to an embodiment 3 of the present invention. A difference of the embodiment 3 from foregoing FIG. 1 is positions of the terminals in the switching devices SW1, SW2. In other words, respective terminals are aligned in a straight line in the order of C1, E1, C2, E2 from the right to the left in FIG. 1, while respective terminals are aligned in a straight line in the order of E1, C1, E2, C2 from the right to the left in FIG. 10.

Figure 11:
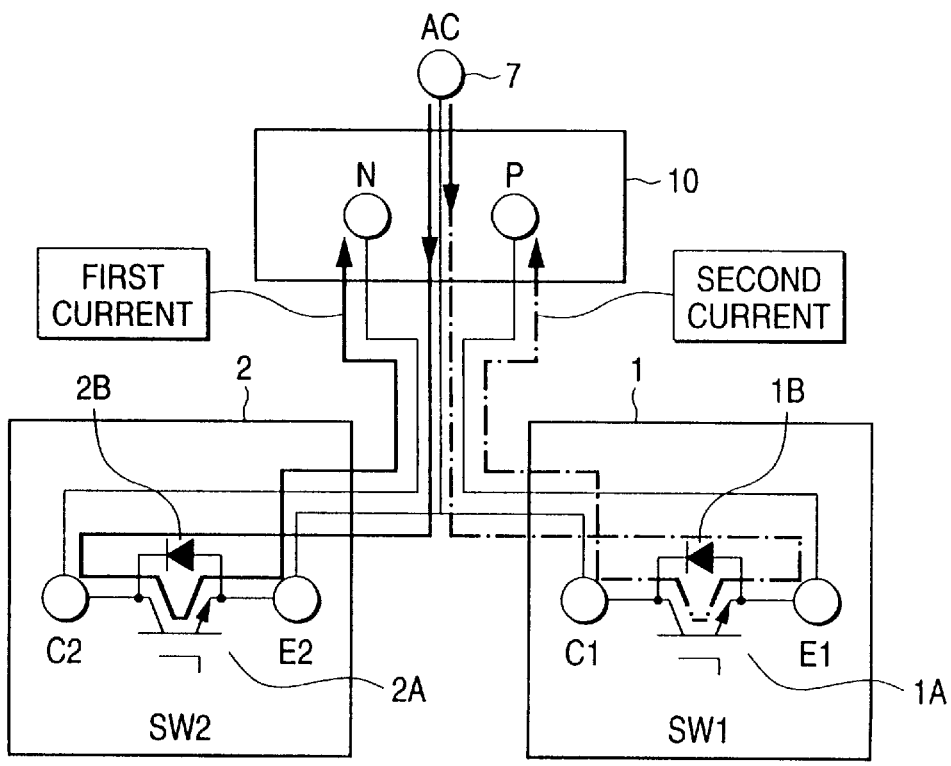
FIG. 11 is a view showing current flow paths of the first current and the second current depicted in FIG. 10.

FIG. 11 shows current flow paths of the first current and the second current depicted on the configuration shown in FIG. 10. More particularly, the round current path of the first current indicated by a thick solid line must be constructed via the route of the AC output terminal 7→the collector terminal C1 of the switching device SW2→the emitter terminal E2 of the same→the negative terminal N of the capacitor 10 such that the forward current path and the backward current path can always be positioned in the close vicinity.

Then, the round current path of the second current indicated by a thick chain line must be constructed via the route of the AC output terminal 7→the emitter terminal E1 of the switching device SW1→the collector terminal C1 of the same→the positive terminal P of the capacitor 10 such that similarly the forward current path and the backward current path can always be positioned in the close vicinity.

As the result of the above configuration, like the case in the embodiment 1, the main circuit wiring inductances L2, L4 as well as main circuit wiring inductances L1, L3, both have an influence upon the turn-off surge voltage, can be reduced significantly.

Figure 12C:
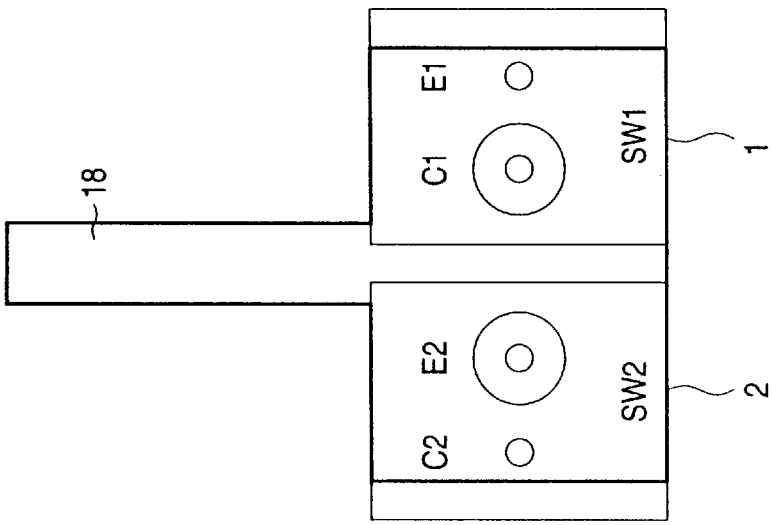
FIGS. 12A, 12B, 12C are plan views showing a connection configuration in the power converter device when the plate-like terminal boards are employed.
Figure 12B:
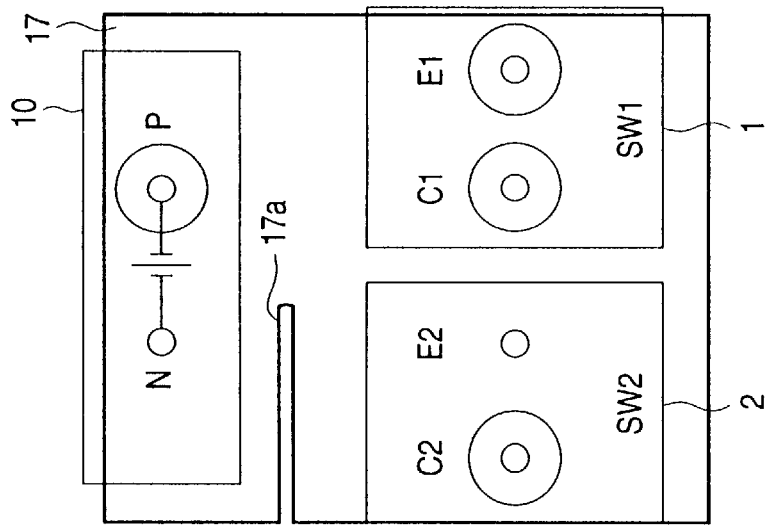
Figure 12A:
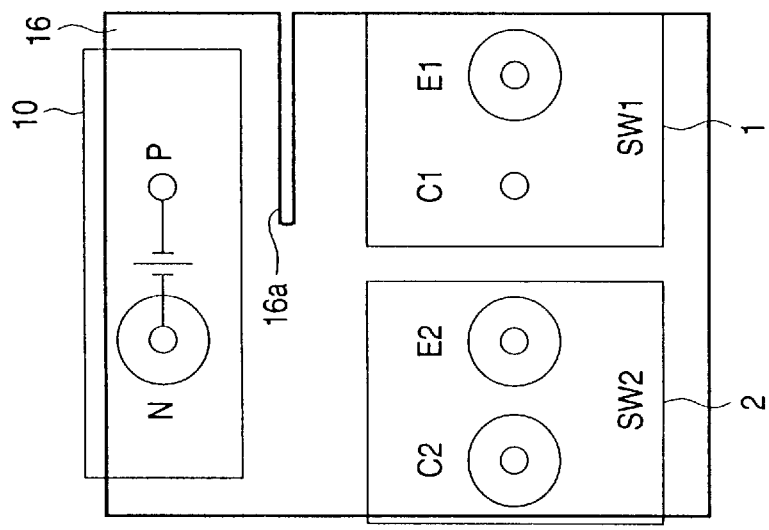

FIGS. 12A, 12B, 12C show the case where the main circuit wiring inductances can be reduced much more by employing the plate-like terminal boards as connecting means between respective terminals shown in FIGS. 10 and 11. FIGS. 12A, 12B, 12C correspond to FIGS. 7A, 7B, 7C in the embodiment 1 respectively.

In FIGS. 12A, 12B, 12C, a reference 16 denotes a P terminal board which is positioned at the uppermost stage. The P terminal board 16 is the plate-like terminal board which connects the positive terminal P of the capacitor 10 and the collector terminal C1 of the switching device SW1 (see FIG. 12A). A reference 16a denotes a slit.

A reference 17 denotes an N terminal board which is positioned below the P terminal board 16 via an insulating plate (not shown). The N terminal board 17 is the plate-like terminal board which connects the negative terminal N of the capacitor 10 and the emitter terminal E2 of the switching device SW2 (see FIG. 12B). A reference 17a denotes a slit.

A reference 18 denotes an AC terminal board which is positioned below the N terminal board 17 via an insulating plate (not shown). The AC terminal board 18 is the plate-like terminal board which connects the AC output terminal 7, the emitter terminal E1 of the switching device SW1, and the collector terminal C2 of the switching device SW2 (see FIG. 12C).

In this case, as in the case shown in FIGS. 7A to 7C, etc. previously, since both the round current path of the first current and the round current path of the second current are formed by the structure in which the terminal boards 16 to 18 which have a large area respectively are arranged to be superposed in parallel with each other via a minute clearance, the main circuit wiring inductances can be reduced considerably and thus the turn-off surge voltage can be suppressed smaller. As a result, the snubber circuit can be omitted, and therefore size reduction, lower loss, and lower cost of the power converter device can be achieved. Further, because of reduction in the number of parts, reliability of the power converter device can be improved.

Embodiment 4

Figure 13:
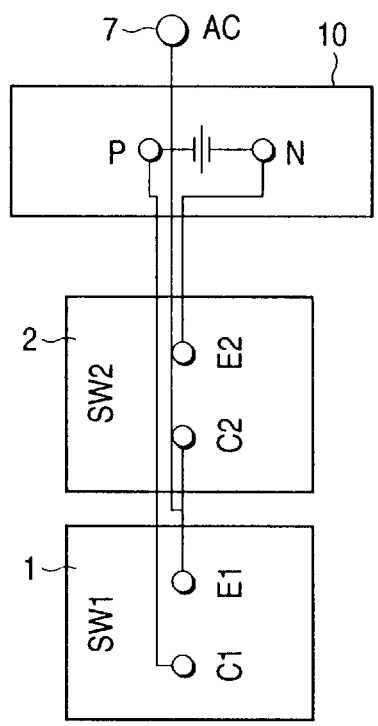
FIG. 13 is a view showing a configuration of element and terminal arrangements and their connection in a power converter device according to an embodiment 4 of the present invention.

FIG. 13 shows arrangement of constituent elements, their terminal positions, and their connection procedures in one-phase configuration of a power converter device according to an embodiment 4 of the present invention. This arrangement is different fairly from those in the above embodiments. In other words, the terminals of both the switching devices SW1, SW2 are also aligned in a straight line, nevertheless this straight line is directed orthogonally with the direction connecting the positive terminal P and the negative terminal N of the capacitor 10. In addition, the switching device SW2 is positioned close to the capacitor 10 rather than the switching device SW1. In this case, the IGBTs of the switching devices and the fly wheel diodes are omitted from FIG. 13 (similarly in FIG. 14 described later).

Figure 14:
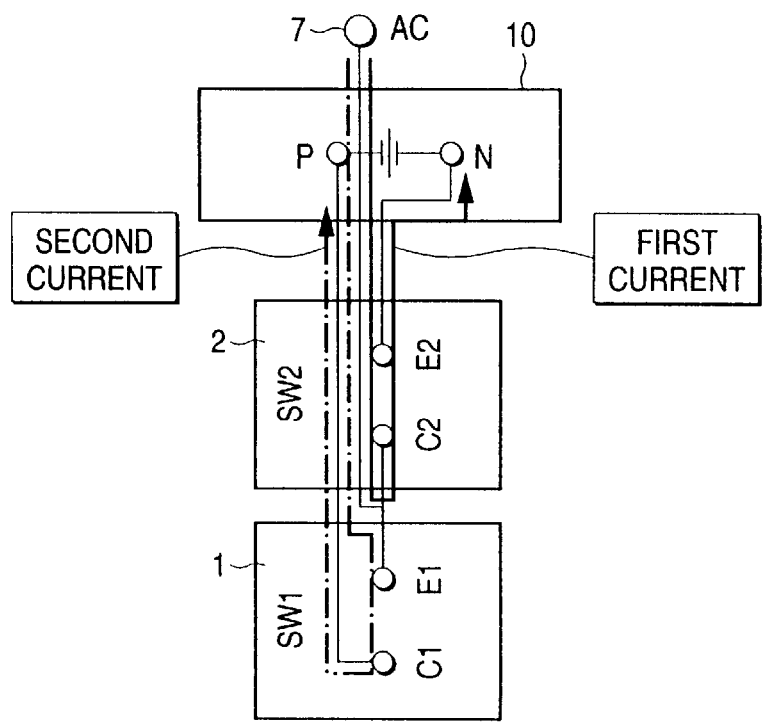
FIG. 14 is a view showing current flow paths of the first current and the second current depicted in FIG. 13.

FIG. 14 shows current flow paths of the first current and the second current in FIG. 3A, which are depicted on the configuration in FIG. 13. More particularly, the round current path of the first current indicated by a thick solid line is constructed via the route of the AC output terminal 7→the collector terminal C2 of the switching device SW2→the emitter terminal E2 of the same→the negative terminal N of the capacitor 10 such that the forward current path and the backward current path can always be positioned in the close vicinity.

Then, the round current path of the second current indicated by a thick chain line is constructed via the route of the AC output terminal 7→the emitter terminal E1 of the switching device SW1→the collector terminal C1 of the same→the positive terminal P of the capacitor 10 such that similarly the forward current path and the backward current path can always be positioned in the close vicinity.

As the result of the above configuration, like the case in the embodiment 1, the main circuit wiring inductances L2, L4 as well as main circuit wiring inductances L1, L3, both have an influence upon the turn-off surge voltage, can be reduced significantly in this case.

FIGS. 15A, 15B, 15C show the case where the main circuit wiring inductances can be reduced much more by employing the plate-like terminal boards as connecting means between respective terminals shown in FIGS. 13 and 14. FIGS. 15A, 15B, 15C correspond to FIGS. 7A, 7B, 7C in the embodiment 1 respectively.

In FIGS. 15A, 15B, 15C, a reference 19 denotes a P terminal board which is positioned at the uppermost stage. The P terminal board 19 is the plate-like terminal board which connects the positive terminal P of the capacitor 10 and the collector terminal C1 of the switching device SW1 (see FIG. 15A).

A reference 20 denotes an N terminal board which is positioned below the P terminal board 19 via an insulating plate (not shown). The N terminal board 20 is the plate-like terminal board which connects the negative terminal N of the capacitor 10 and the emitter terminal E2 of the switching device SW2 (see FIG. 15B).

A reference 21 denotes an AC terminal board which is positioned below the N terminal board 20 via an insulating plate (not shown). The AC terminal board 21 is the plate-like terminal board which connects the AC output terminal 7, the emitter terminal E1 of the switching device SW1, and the collector terminal C2 of the switching device SW2 (see FIG. 15C).

Figure 16:
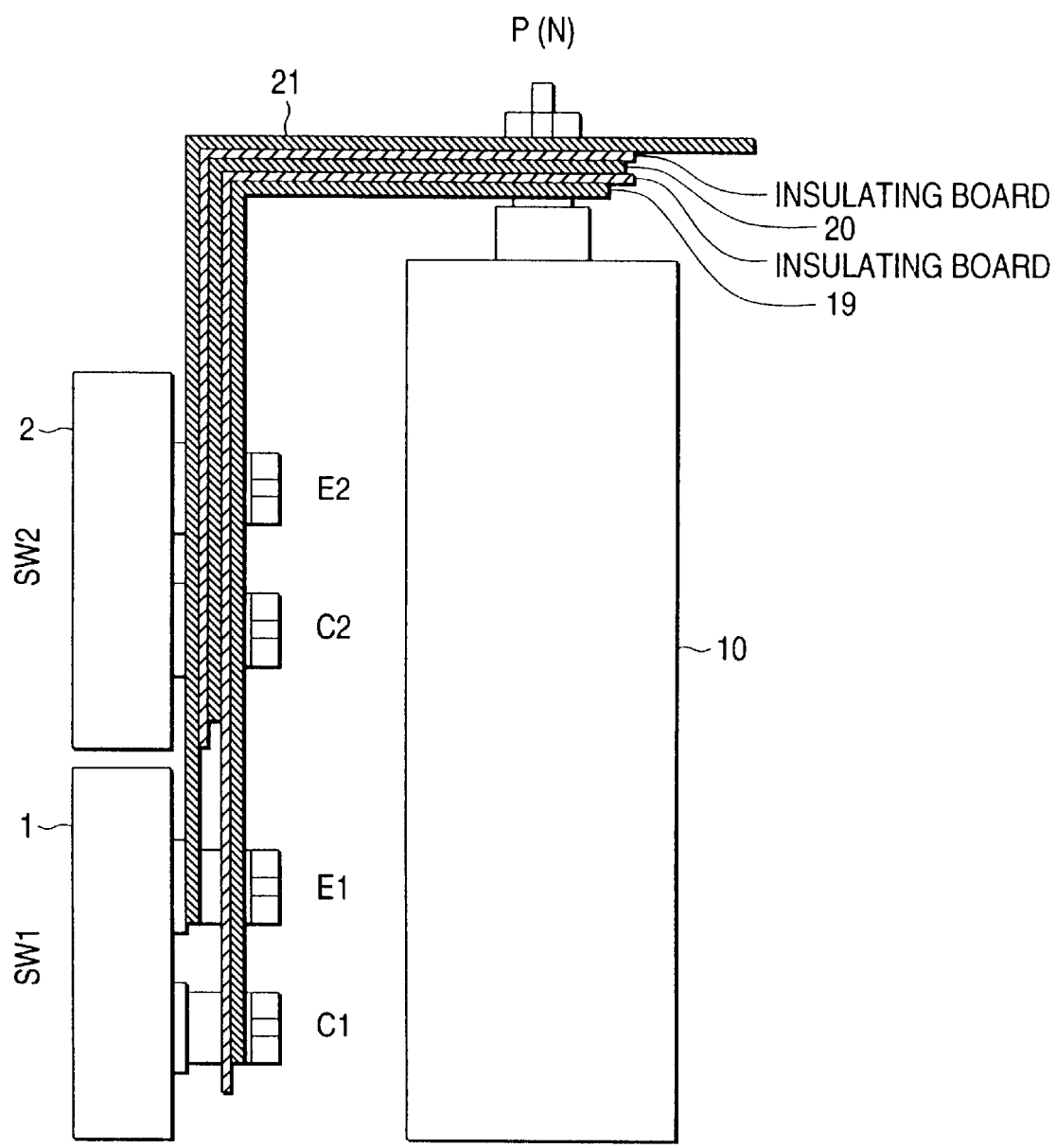
FIG. 16 is a side view showing the power converter device in FIGS. 15A to 15C.

FIG. 16 is a side view showing the power converter device which is assembled by using the terminal boards 19 to 21 in FIGS. 15A to 15C. However, in FIG. 16, the terminal boards 19 to 21 and the insulating plates are bent by a right angle in the middle with regard to the shape of the capacitor 10, whereby reduction in an outer size of the entire power converter device can be achieved.

As discussed above, in this case, as in the case shown in FIGS. 7A to 7C, etc. previously, since both the round current path of the first current and the round current path of the second current are formed by the structure in which the terminal boards 19 to 21 which have a large area respectively are arranged to be superposed in parallel with each other via a minute clearance, the main circuit wiring inductances can be reduced considerably and thus the turn-off surge voltage can be suppressed smaller. As a result, the snubber circuit can be omitted, and therefore size reduction, lower loss, and lower cost of the power converter device can be achieved. Moreover, because of reduction in the number of parts, reliability of the power converter device can be improved.

Embodiment 5

Figure 17A:
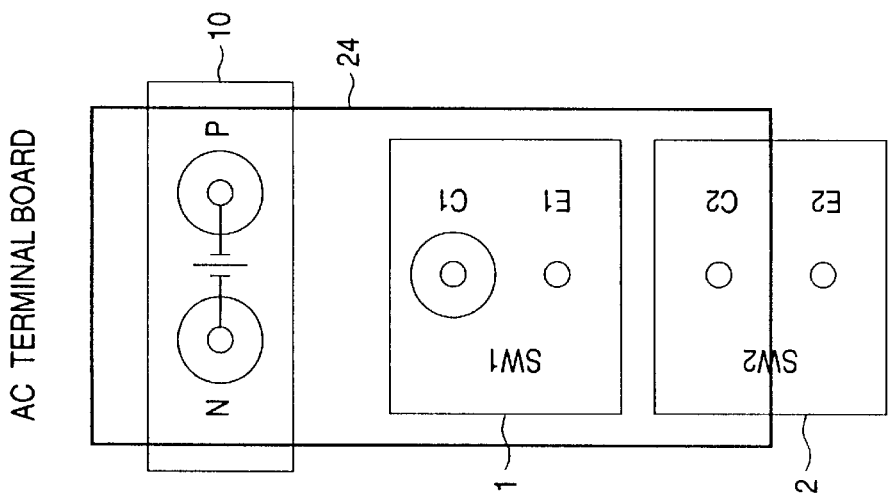
FIGS. 17A, 17B, 17C are plan views showing a power converter device according to an embodiment 5 of the present invention.
Figure 17B:
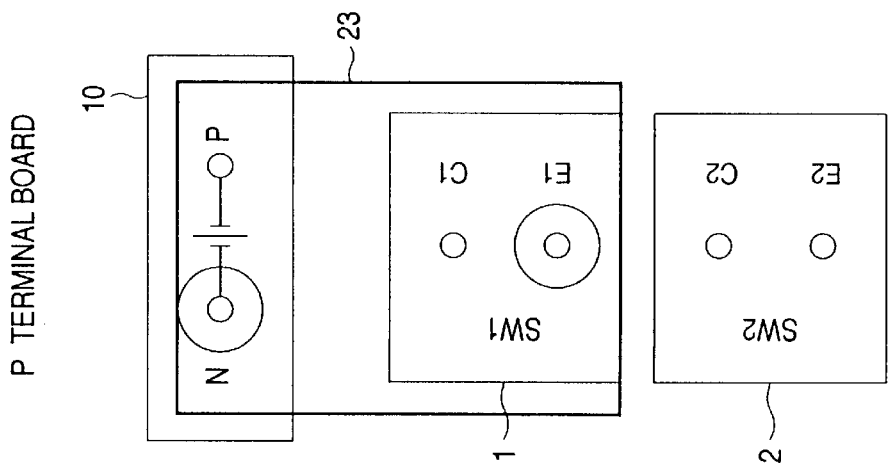
Figure 17C:
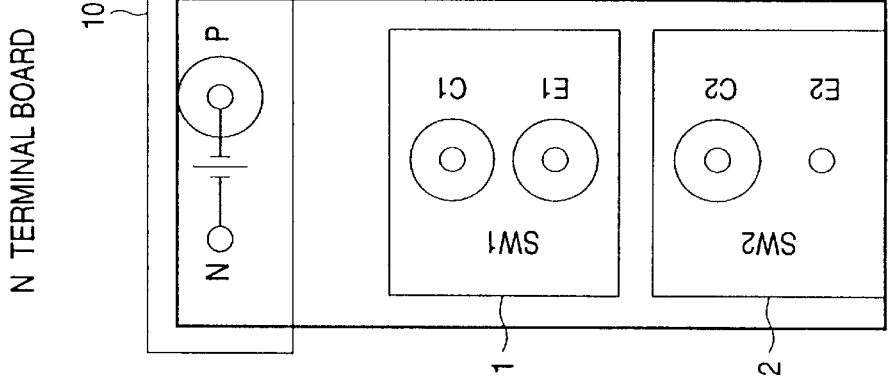
Figure 18:
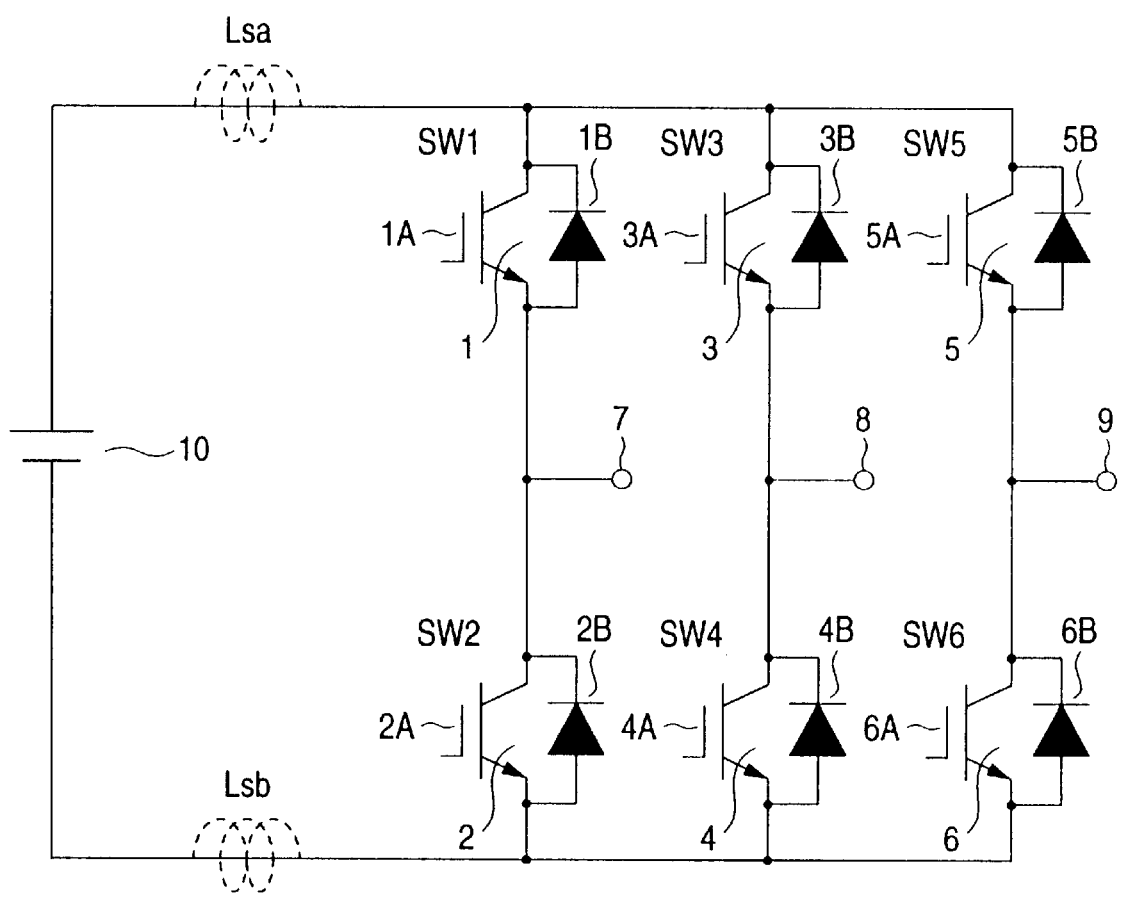
FIG. 18 is a view showing a main circuit configuration of a three-phase power converter device.

FIGS. 17A, 17B, 17C are plan views showing a power converter device according to an embodiment 5 of the present invention. In particular, FIGS. 17A, 17B, 17C, which correspond to FIGS. 15A, 15B, 15C in the above embodiment 4, are plan views showing terminal boards of the power converter device.

In FIGS. 17A, 17B, 17C, a reference 22 denotes an N terminal board which is positioned at the uppermost stage. The N terminal board 22 is the plate-like terminal board which connects the negative terminal N of the capacitor 10 and the emitter terminal E2 of the switching device SW2 (see FIG. 17A).

A reference 23 denotes a P terminal board which is positioned below the N terminal board 22 via an insulating plate (not shown). The P terminal board 23 is the plate-like terminal board which connects the positive terminal P of the capacitor 10 and the collector terminal C1 of the switching device SW1 (see FIG. 17B).

A reference 24 denotes an AC terminal board which is positioned below the P terminal board 23 via an insulating plate (not shown). The AC terminal board 24 is the plate-like terminal board which connects the AC output terminal 7, the emitter terminal E1 of the switching device SW1, and the collector terminal C2 of the switching device SW2 (see FIG. 17C).

As discussed above, in this case, as in the case shown in FIGS. 15A to 15C, etc. previously, since both the round current path of the first current and the round current path of the second current are formed by the structure in which the terminal boards 22 to 24 which have a large area respectively are arranged to be superposed in parallel with each other via a minute clearance, the main circuit wiring inductances can be reduced considerably and thus the turn-off surge voltage can be suppressed smaller. As a result, the snubber circuit can be omitted, and therefore size reduction, lower loss, and lower cost of the power converter device can be achieved. Furthermore, because of reduction in the number of parts, reliability of the power converter device can be improved.

The explanation has been made with reference to the single phase configuration in all the embodiments, but it is of course that the present invention can be constructed as a multi-phase power converter device such as a three-phase configuration. In addition, although one parallel IGBT module has been employed as the switching device, plural parallel-connected IGBT modules such as two or more may be employed.

The switching device is not limited to the IGBT, and it is also of course that various devices such as a transistor, an intelligent power module, an FET, a GCT (Gate Communicated Thyristor), etc. may be employed.

As described above, the power converter device of claim 1 comprises a direct current voltage source having a positive terminal and a negative terminal; a first switching device whose anode terminal is connected to the positive terminal of the direct current voltage source; a second switching device whose anode terminal is connected to a cathode terminal of the first switching device and whose cathode terminal is connected to the negative terminal of the direct current voltage source; and an alternating current output terminal extended from a connection point of the first switching device and the second switching device; wherein respective terminals and connecting means provided between respective terminals can be arranged such that a first current path, which extends from the alternating current output terminal to the negative terminal of the direct current voltage source via the second switching device, is provided to form a first round current path whose forward and backward current paths are positioned mutually in a close vicinity and also a second current path, which extends from the alternating current output terminal to the positive terminal of the direct current voltage source via the first switching device, is provided to form a second round current path whose forward and backward current paths are positioned mutually in the close vicinity. Therefore, thorough reduction in the main circuit wiring inductance can be achieved, and also the turn-off surge voltage which is applied to the switching device by the commutating operation of the switching device can be suppressed considerably.

In the power converter device of claim 2, the first switching device and the second switching device are arranged such that respective terminals of the first switching device and the second switching device can be aligned substantially in a straight line, the direct current voltage source is positioned such that a direction connecting both terminals of the direct current voltage source can be set substantially in parallel with a direction of the straight line, and the alternating current output terminal is positioned in a middle position between both terminals of the direct current voltage source. Therefore, device arrangement to enable reduction in the main circuit wiring inductance without fail can be achieved.

In the power converter device of claim 3, the direct current voltage source, the first switching device, and the second switching device are positioned such that a direction directed from the positive terminal of the direct current voltage source to the negative terminal thereof can be set to coincide with a direction directed from the anode terminal of the first switching device to the cathode terminal thereof and a direction directed from the anode terminal of the second switching device to the cathode terminal thereof. Therefore, terminal arrangement to enable reduction in the main circuit wiring inductance without fail can be achieved.

In the power converter device of claim 4, the direct current voltage source, the first switching device, and the second switching device are positioned such that a direction directed from the positive terminal of the direct current voltage source to the negative terminal thereof can be set to coincide with a direction directed from the cathode terminal of the first switching device to the anode terminal thereof and a direction directed from the cathode terminal of the second switching device to the anode terminal thereof. Therefore, terminal arrangement to enable reduction in the main circuit wiring inductance without fail can be achieved.

In the power converter device of claim 5, the first switching device and the second switching device are arranged such that respective terminals of the first switching device and the second switching device can be aligned substantially in a straight line, the direct current voltage source is positioned such that a direction connecting both terminals of the direct current voltage source can be set by a substantially right angle relative to a direction of the straight line, and the alternating current output terminal is positioned in a middle position between both terminals of the direct current voltage source. Therefore, device arrangement to enable reduction in the main circuit wiring inductance without fail can be achieved.

In the power converter device of claim 6, the first switching device is positioned close to the direct current voltage source rather than the second switching device. Therefore, terminal arrangement to enable reduction in the main circuit wiring inductance without fail can be achieved.

In the power converter device of claim 7, the second switching device is positioned close to the direct current voltage source rather than the first switching device. Therefore, terminal arrangement to enable reduction in the main circuit wiring inductance without fail can be achieved.

In the power converter device of claim 8, a connecting means for connecting the positive terminal of the direct current voltage source and the anode terminal of the first switching device, a connecting means for connecting the negative terminal of the direct current voltage source and the cathode terminal of the second switching device, and a connecting means for connecting the cathode terminal of the first switching device, the anode terminal of the second switching device, and the alternating current output terminal are arranged to be superposed in parallel with each other via an insulating plate respectively to thus construct a plate-like terminal board. Therefore, the main circuit wiring inductance can be reduced much more.

The power converter device of claim 9 comprises a plurality of power converter devices set forth in any one of claims 1 to 8; wherein multi-phase alternating current voltages which have phase difference mutually can be output. Therefore, the multi-phase power converter device in which the main circuit wiring inductance is reduced can be achieved.

What is claimed is:

1. A power converter device comprising:
    a direct current voltage source having a positive terminal and a negative terminal;
    a first switching device whose anode terminal is connected to the positive terminal of the direct current voltage source;
    a second switching device whose anode terminal is connected to a cathode terminal of the first switching device and whose cathode terminal is connected to the negative terminal of the direct current voltage source;
    an alternating current output terminal extended from a connection point of the first switching device and the second switching device;

a first current path, which extends from the alternating current output terminal to the negative terminal of the direct current voltage source via the second switching device, being provided to form a first round current path whose forward and backward current paths are positioned mutually in a close vicinity; and a second current path, which extends from the alternating current output terminal to the positive terminal of the direct current voltage source via the first switching device, is provided to form a second round current path whose forward and backward current paths are positioned mutually in the close vicinity.

2. A power converter device according to claim 1, wherein respective terminals of the first switching device and the second switching device are aligned substantially in a straight line, a direction connecting both terminals of the direct current voltage source is set substantially in parallel with a direction of the straight line, and the alternating current output terminal is positioned in a middle position between both terminals of the direct current voltage source.

3. A power converter device according to claim 2, wherein a direction directed from the positive terminal of the direct current voltage source to the negative terminal thereof is set to coincide with a direction directed from the anode terminal of the first switching device to the cathode terminal thereof and a direction directed from the anode terminal of the second switching device to the cathode terminal thereof.

4. A power converter device according to claim 2, wherein a direction directed from the positive terminal of the direct current voltage source to the negative terminal thereof can be set to coincide with a direction directed from the cathode terminal of the first switching device to the anode terminal thereof and a direction directed from the cathode terminal of the second switching device to the anode terminal thereof.

5. A power converter device according to claim 1, wherein respective terminals of the first switching device and the second switching device are aligned substantially in a straight line, a direction connecting both terminals of the direct current voltage source can be set by a substantially right angle relative to a direction of the straight line, and the alternating current output terminal is positioned in a middle position between both terminals of the direct current voltage source.

6. A power converter device according to claim 5, wherein the first switching device is positioned close to the direct current voltage source rather than the second switching device.

7. A power converter device according to claim 5, wherein the second switching device is positioned close to the direct current voltage source rather than the first switching device.

8. A power converter device according to claim 1, wherein plate-like terminal boards are superposed in parallel with each other through an insulating plate respectively whereby connecting the positive terminal of the direct current voltage source and the anode terminal of the first switching device, connecting the negative terminal of the direct current voltage source and the cathode terminal of the second switching device, and connecting the cathode terminal of the first switching device, the anode terminal of the second switching device, and the alternating current output terminal.

9. A power converter device comprising a plurality of power converter devices according to claim 1;

wherein multi-phase alternating current voltages which have phase difference mutually can be output.

* * * * *